United States Patent
Ito

(10) Patent No.: US 11,810,703 B2
(45) Date of Patent: Nov. 7, 2023

(54) MULTILAYER COIL CIRCUIT SUBSTRATE

(71) Applicant: Murata Manufacturing Co., Ltd., Nagaokakyo (JP)

(72) Inventor: Yuki Ito, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 1267 days.

(21) Appl. No.: 16/166,227

(22) Filed: Oct. 22, 2018

(65) Prior Publication Data

US 2019/0057800 A1 Feb. 21, 2019

Related U.S. Application Data

(63) Continuation of application No. PCT/JP2017/017126, filed on May 1, 2017.

(30) Foreign Application Priority Data

May 19, 2016 (JP) ................................ 2016-100034

(51) Int. Cl.
  *H01F 17/00* (2006.01)
  *H05K 3/46* (2006.01)
  (Continued)

(52) U.S. Cl.
  CPC ....... *H01F 17/0013* (2013.01); *H01F 41/041* (2013.01); *H05K 1/165* (2013.01);
  (Continued)

(58) Field of Classification Search
  CPC ... H01F 17/0013; H01F 41/041; H05K 1/115; H05K 1/165; H05K 2201/0129
  See application file for complete search history.

(56) References Cited

U.S. PATENT DOCUMENTS 4,873,757 A * 10/1989 Williams ............ H01F 17/0013
  29/852
5,731,066 A * 3/1998 Ando ................ H01L 23/49811
  257/E23.068
(Continued)

FOREIGN PATENT DOCUMENTS

CN 101331564 A * 12/2008 ......... H01F 17/0013
JP 07-142256 A 6/1995
(Continued)

OTHER PUBLICATIONS

Official Communication issued in International Patent Application No. PCT/JP2017/017126, dated Jun. 6, 2017.

*Primary Examiner* — Jeffrey T Carley
(74) *Attorney, Agent, or Firm* — KEATING & BENNETT, LLP

(57) ABSTRACT

A multilayer substrate includes an element assembly including a second insulating layer and a first insulating layer arranged in this order from a first side to a second side with respect to a layer stacking direction, a first conductor layer on the first side of the first insulating layer and including a plated layer, and a second conductor layer on the first side of the second insulating layer. The first conductor layer includes a first connection portion and a first circuit portion, and the second conductor layer includes a second connection portion and a second circuit portion. When viewed from the layer stacking direction, the first circuit portion includes an overlapping portion which overlaps the second circuit portion. A portion of the first connection portion connected to the second connection portion has a maximum thickness greater than a maximum thickness of the overlapping portion.

5 Claims, 14 Drawing Sheets

(51) Int. Cl.
*H05K 3/06* (2006.01)
*H05K 3/00* (2006.01)
*H05K 3/24* (2006.01)
*H05K 3/18* (2006.01)
*H01F 41/04* (2006.01)
*H05K 1/16* (2006.01)
*H05K 1/11* (2006.01)
*H05K 3/40* (2006.01)

(52) U.S. Cl.
CPC ............ *H05K 3/00* (2013.01); *H05K 3/0052* (2013.01); *H05K 3/06* (2013.01); *H05K 3/18* (2013.01); *H05K 3/188* (2013.01); *H05K 3/24* (2013.01); *H05K 3/46* (2013.01); *H05K 3/4661* (2013.01); *H01F 2017/002* (2013.01); *H05K 1/115* (2013.01); *H05K 3/0023* (2013.01); *H05K 3/0032* (2013.01); *H05K 3/064* (2013.01); *H05K 3/4069* (2013.01); *H05K 2201/0129* (2013.01); *H05K 2203/0723* (2013.01); *H05K 2203/107* (2013.01)

(56) References Cited

U.S. PATENT DOCUMENTS

| | | | | |
|---|---|---|---|---|
| 6,198,123 | B1 * | 3/2001 | Linder ................ | H01L 28/40 |
| | | | | 257/305 |
| 10,043,770 | B2 * | 8/2018 | Chen ................. | H01L 21/566 |
| 10,431,531 | B2 * | 10/2019 | Kwang ............ | H01L 23/49575 |
| 2002/0033652 | A1 * | 3/2002 | Serizawa ............ | H03H 9/1021 |
| | | | | 310/345 |
| 2002/0066179 | A1 * | 6/2002 | Hall .................... | H05K 3/4069 |
| | | | | 118/500 |
| 2002/0066963 | A1 * | 6/2002 | Embong ............... | H01L 24/84 |
| | | | | 257/784 |
| 2002/0121957 | A1 * | 9/2002 | Takashima .......... | H01F 17/0013 |
| | | | | 336/200 |
| 2003/0072142 | A1 * | 4/2003 | Takenaka ............... | H05K 3/325 |
| | | | | 361/792 |
| 2003/0216025 | A1 * | 11/2003 | Lu ........................... | H01L 24/03 |
| | | | | 257/E21.174 |
| 2008/0038562 | A1 * | 2/2008 | Ito ....................... | H01F 17/0013 |
| | | | | 428/411.1 |
| 2008/0093117 | A1 * | 4/2008 | Oikawa ............ | H01L 23/49827 |
| | | | | 174/262 |
| 2009/0243784 | A1 * | 10/2009 | Iwasaki ............... | H01F 17/0013 |
| | | | | 336/200 |
| 2011/0180306 | A1 * | 7/2011 | Naganuma ............. | H05K 1/115 |
| | | | | 174/254 |
| 2011/0240356 | A1 * | 10/2011 | Wakita ................. | H05K 3/4644 |
| | | | | 29/829 |
| 2012/0175153 | A1 * | 7/2012 | Kaneko ................ | H05K 3/4682 |
| | | | | 174/251 |
| 2013/0200977 | A1 | 8/2013 | Miyazaki et al. | |
| 2014/0078643 | A1 | 3/2014 | Odahara | |

FOREIGN PATENT DOCUMENTS

| | | |
|---|---|---|
| JP | 2012-015291 A | 1/2012 |
| JP | 5839535 B2 | 1/2016 |
| WO | 2011/145490 A1 | 11/2011 |
| WO | 2012/172939 A1 | 12/2012 |

* cited by examiner

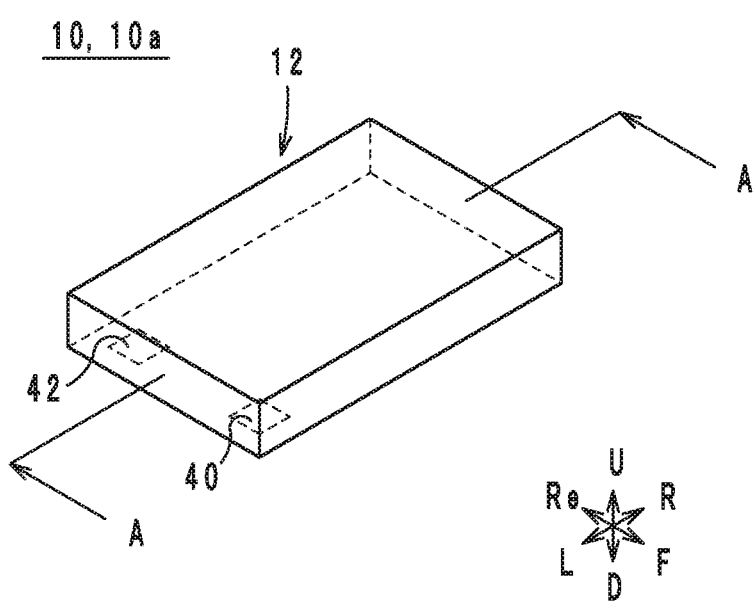

50: 20, 24, 26, 28, 34, 36, 38
52: 22, 30, 32

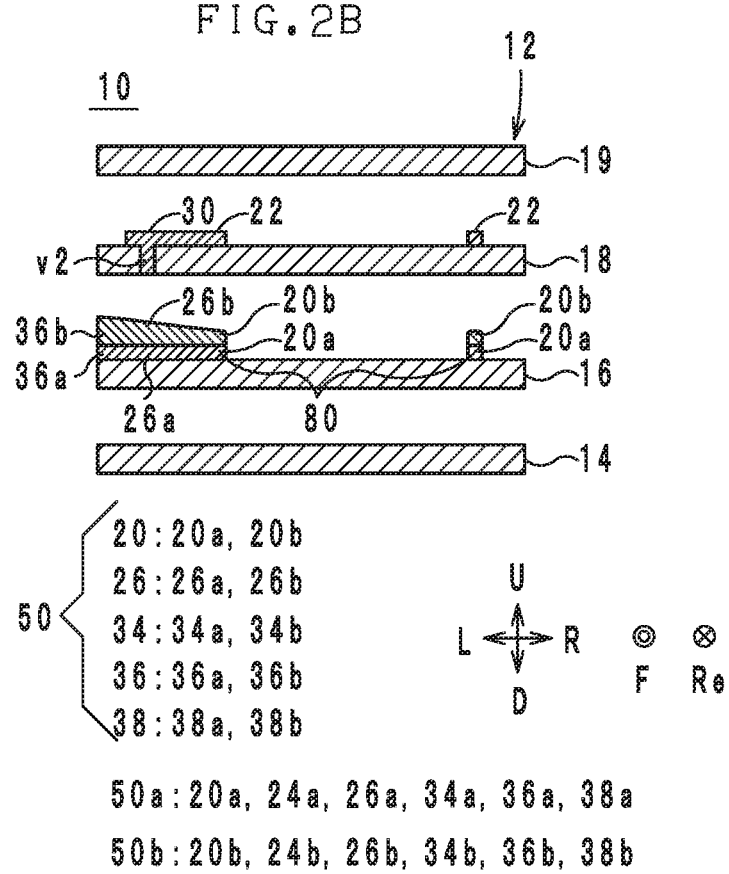

FIG.3
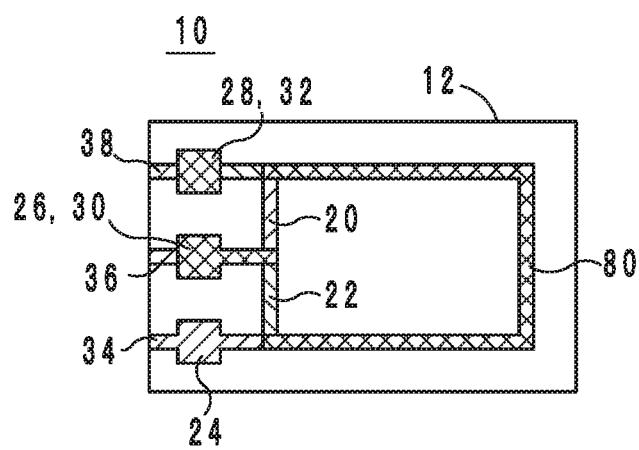
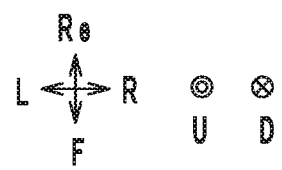

FIG.5
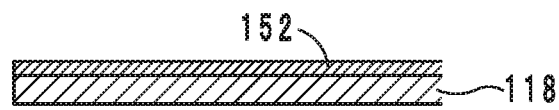
FIG.6
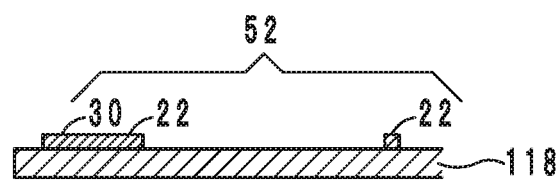
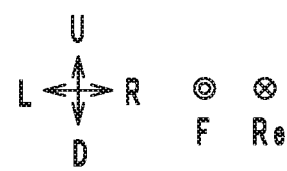
FIG.7
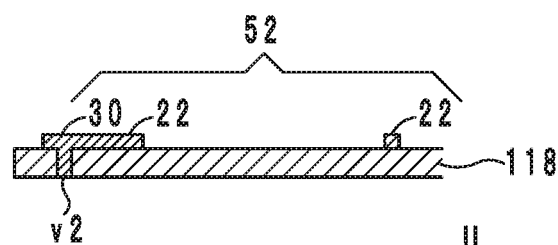
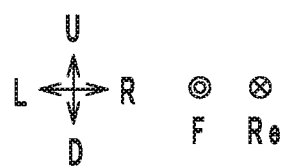

FIG.8A
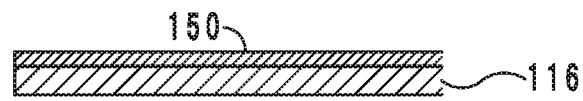
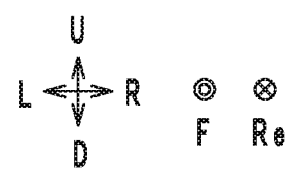
FIG.8B
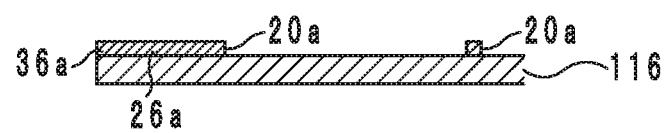
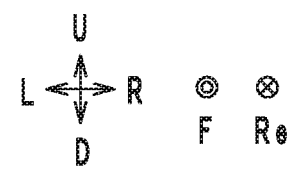
FIG.8C
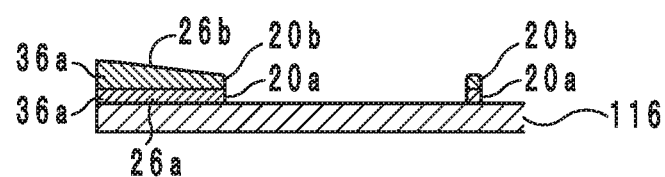
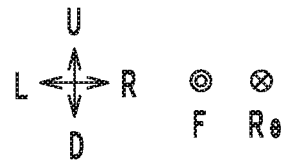

FIG.9
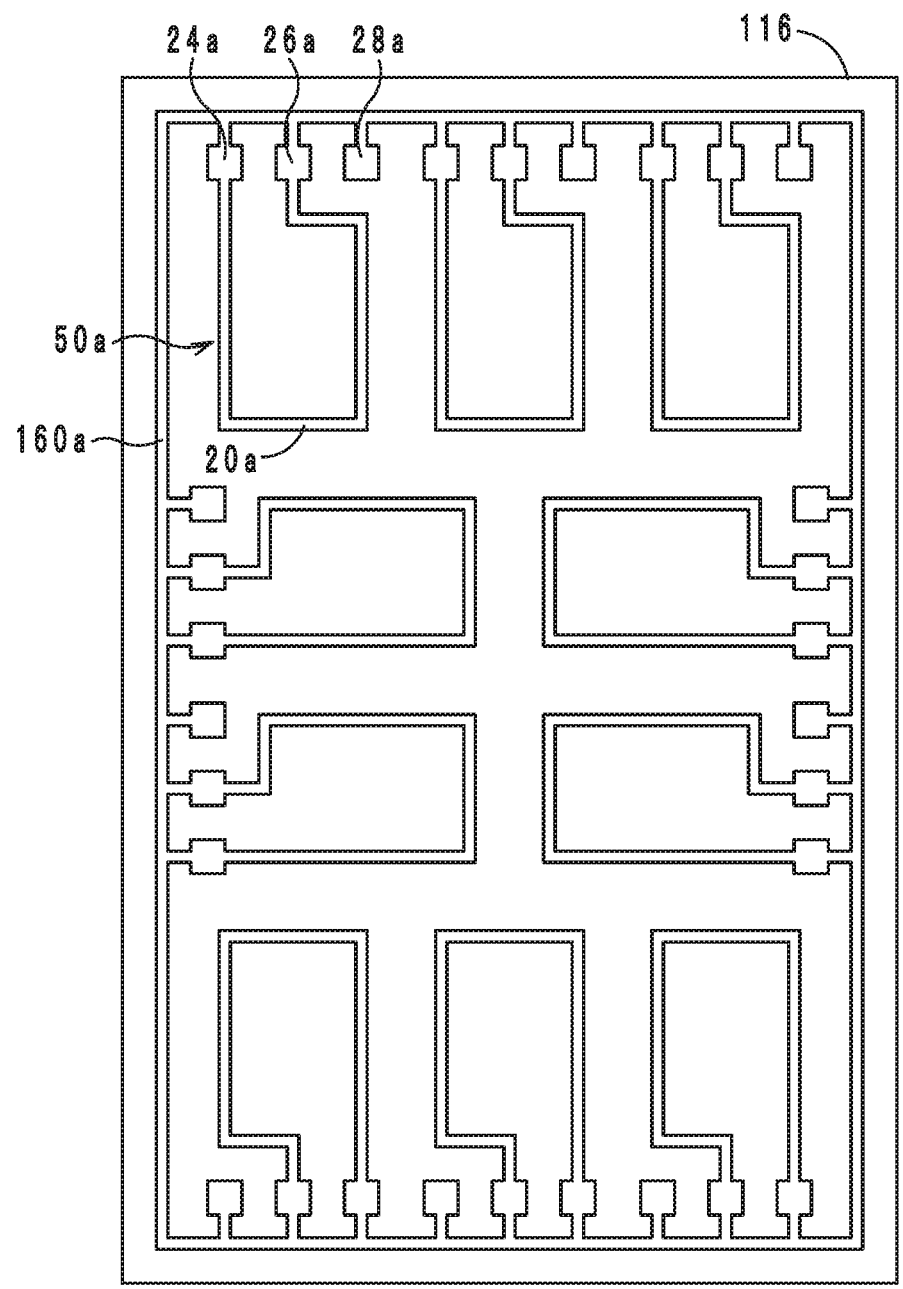
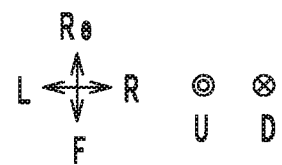

FIG. 10
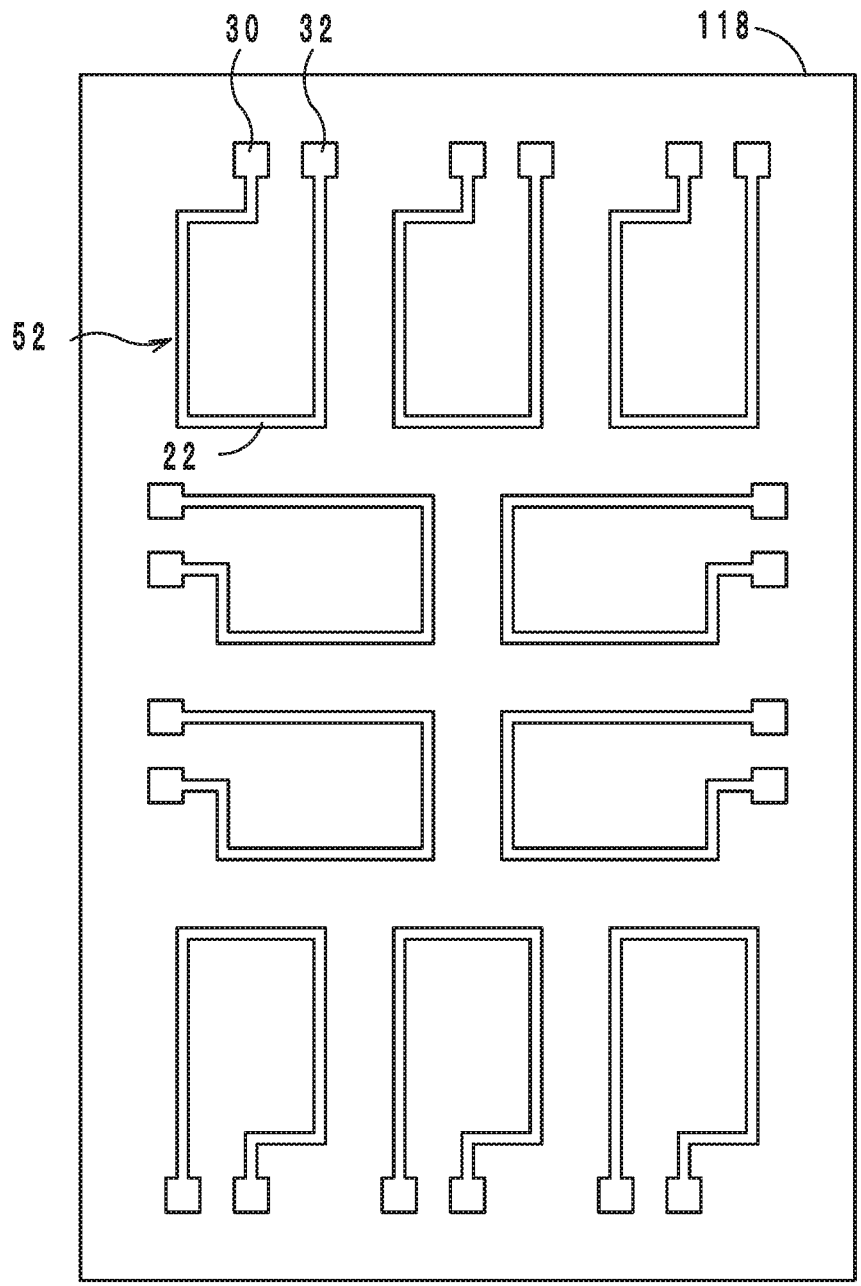
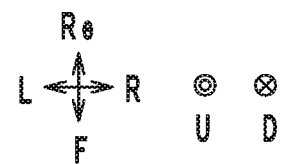

FIG.11
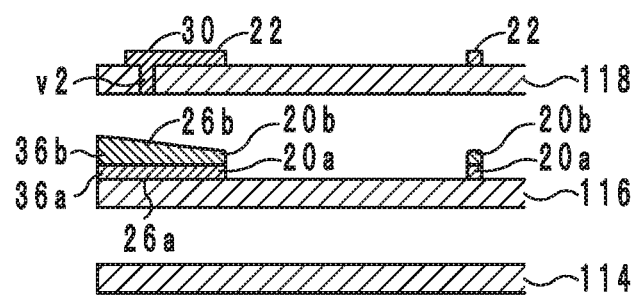
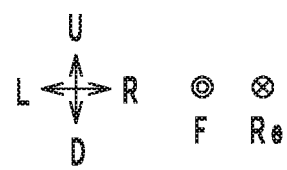

50: 20, 24, 26, 28, 34, 36, 38
52: 22, 30, 32, 336, 338

MULTILAYER COIL CIRCUIT SUBSTRATE

CROSS REFERENCE TO RELATED APPLICATIONS

This application claims the benefit of priority to Japanese Patent Application No. 2016-100034 filed on May 19, 2016 and is a Continuation Application of PCT Application No. PCT/JP2017/017126 filed on May 1, 2017. The entire contents of each application are hereby incorporated herein by reference.

BACKGROUND OF THE INVENTION

1. Field of the Invention

The present invention relates to a multilayer substrate and a manufacturing method of the multilayer substrate, and more particularly, to a multilayer substrate including a conductor layer defining a plated layer, and a manufacturing method of the multilayer substrate.

2. Description of the Related Art

As a past invention relating to a multilayer substrate, for example, a planar coil disclosed in Japanese Patent No. 5839535 is known. The planar coil includes two resin layers and two wirings. The two resin layers are stacked on each other in an up-down direction. The two wirings are disposed in the respective two resin layers and are formed by plating. When viewed from above, each of the two wirings has a spiral shape, and the two wirings are positioned in an area so as to overlap each other. The centers of the respective wirings are connected to each other.

In the planar coil disclosed in Japanese Patent No. 5839535, the wirings are formed by plating. The wirings formed by plating have large thicknesses. Further, the two wirings are positioned in an area so as to overlap each other when viewed from above. Therefore, the interval in the up-down direction between the two wirings is short, and the two wirings are likely to short-circuit.

SUMMARY OF THE INVENTION

Preferred embodiments of the present invention provide multilayer substrates in each of which the risk of a short circuit between conductor layers is reduced, and manufacturing methods of the multilayer substrate.

A multilayer substrate according to a first preferred embodiment of the present invention includes an element assembly including a first insulating layer and a second insulating layer, stacked in layers such that the second insulating layer and the first insulating layer are arranged in this order from a first side to a second side with respect to a layer stacking direction; a first conductor layer disposed on a first principal surface of the first insulating layer and including a plated layer, the first principal surface being on the first side of the first insulating layer with respect to the layer stacking direction; and a second conductor layer disposed on a first principal surface of the second insulating layer, the first principal surface being on the first side of the second insulating layer with respect to the layer stacking direction; wherein the first conductor layer includes a first connection portion and a first circuit portion which is a signal transmission path; the second conductor layer includes a second connection portion and a second circuit portion which is a signal transmission path; the first connection portion and the second connection portion are connected to each other; when viewed from the layer stacking direction, the first circuit portion includes an overlapping portion which overlaps the second circuit portion; a portion of the first connection portion which connects with the second connection portion has a maximum thickness greater than a maximum thickness of the overlapping portion; and the plated layer in the portion of the first connection portion which connects with the second connection portion has a maximum thickness greater than a maximum thickness of the plated layer in the overlapping portion.

A multilayer substrate according to a second preferred embodiment of the present invention includes an element assembly including a first insulating layer, a second insulating layer, and a third insulating layer, stacked in layers such that the second insulating layer, the third insulating layer, and the first insulating layer are arranged in this order from a first side to a second side with respect to a layer stacking direction; a first conductor layer disposed on a first principal surface of the first insulating layer and including a plated layer, the first principal surface being on the first side of the first insulating layer with respect to the layer stacking direction; and a second conductor layer disposed on a second principal surface of the second insulating layer, the second principal surface being on the second side of the second insulating layer with respect to the layer stacking direction; wherein the first conductor layer includes a first connection portion and a first circuit portion which is a signal transmission path; the second conductor layer includes a second connection portion and a second circuit portion which is a signal transmission path; the first connection portion and the second connection portion are connected to each other; when viewed from the layer stacking direction, the first circuit portion includes an overlapping portion which overlaps the second circuit portion; a portion of the first connection portion which connects with the second connection portion has a maximum thickness greater than a maximum thickness of the overlapping portion; and the plated layer in the portion of the first connection portion which connects with the second connection portion has a maximum thickness greater than a maximum thickness of the plated layer in the overlapping portion.

A manufacturing method of multilayer substrates according to the first preferred embodiment of the present invention is a method for manufacturing multilayer substrates each including an element assembly including a first insulating layer and a second insulating layer, stacked in layers such that the second insulating layer and the first insulating layer are arranged in this order from a first side to a second side with respect to a layer stacking direction; a first conductor layer disposed on a first principal surface of the first insulating layer and including a plated layer, the first principal surface being on the first side of the first insulating layer with respect to the layer stacking direction; and a second conductor layer disposed on a first principal surface of the second insulating layer, the first principal surface being on the first side of the second insulating layer with respect to the layer stacking direction; wherein the first conductor layer includes a first connection portion and a first circuit portion which is a signal transmission path; and the second conductor layer includes a second connection portion and a second circuit portion which is a signal transmission path. The method includes forming a plurality of first conductor layers for the multilayer substrates on a first principal surface of a first mother insulating layer by a process including electroplating, the first principal surface being on the first side of the first mother insulating layer with respect to the layer stacking direction; forming a plurality of second conductor layers for the multilayer substrates on a first principal surface of a second mother insulating layer, the first principal surface being on the first side of the second mother insulating layer with respect to the layer stacking direction; forming a plurality of interlayer connection portions to connect the first connection portions of the respective first conductor layers and the second connection portions of the respective second conductor layers; forming a mother element assembly by stacking the first mother insulating layer and the second mother insulating layer in layers such that the second mother insulating layer and the first mother insulating layer are arranged in this order from the first side to the second side with respect to the layer stacking direction; and cutting the mother element assembly into a plurality of element assemblies; wherein in the forming the plurality of first conductor layers, the plurality of first conductor layers are formed such that, when viewed from the layer stacking direction, an outer edge of the first mother insulating layer is at a shorter distance from the first connection portions of the respective first conductor layers than from the first circuit portions of the respective first conductor layers.

A manufacturing method of multilayer substrates according to the second preferred embodiment of the present invention is a method for manufacturing multilayer substrates each including an element assembly including a first insulating layer, a second insulating layer, and a third insulating layer, stacked in layers such that the second insulating layer, the third insulating layer, and the first insulating layer are arranged in this order from a first side to a second side with respect to a layer stacking direction; a first conductor layer disposed on a first principal surface of the first insulating layer and including a plated layer, the first principal surface being on the first side of the first insulating layer with respect to the layer stacking direction; and a second conductor layer disposed on a second principal surface of the second insulating layer, the second principal surface being on the second side of the second insulating layer with respect to the layer stacking direction; wherein the first conductor layer includes a first connection portion and a first circuit portion which is a signal transmission path; the second conductor layer includes a second connection portion and a second circuit portion which is a signal transmission path; the method including forming a plurality of first conductor layers for the multilayer substrates on a first principal surface of a first mother insulating layer by a process including plating, the first principal surface being on the first side of the first mother insulating layer with respect to the layer stacking direction; forming a plurality of second conductor layers for the multilayer substrates on a second principal surface of a second mother insulating layer, the second principal surface being on the second side of the second mother insulating layer with respect to the layer stacking direction; forming a mother element assembly by stacking the second mother insulating layer, the third mother insulating layer, and the first mother insulating layer in layers in this order such that the first connection portions of the respective first conductor layers are connected to the second connection portions of the respective second conductor layers; and cutting the mother element assembly into a plurality of element assemblies; wherein in the forming the plurality of first conductor layers, the plurality of first conductor layers are formed such that, when viewed from the layer stacking direction, an outer edge of the first mother insulating layer is at shorter distance from the first connection portions of the respective first conductor layers than from the first circuit portions of the respective first conductor layers.

Preferred embodiments of the present invention reduce the risk of short circuits between conductor layers.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1 is a perspective view showing the external appearance of multilayer substrates 10 and 10a according to preferred embodiments of the present invention.

FIG. 2B is an exploded sectional view of the multilayer substrate 10.

FIG. 3 is a top transparent view of the multilayer substrate 10.

FIG. 5 is a sectional view showing a step of a manufacturing process of the multilayer substrate 10.

FIG. 6 is a sectional view showing a step of the manufacturing process of the multilayer substrate 10.

FIG. 7 is a sectional view showing a step of the manufacturing process of the multilayer substrate 10.

FIG. 8A is a sectional view showing a step of the manufacturing process of the multilayer substrate 10.

FIG. 8B is a sectional view showing a step of the manufacturing process of the multilayer substrate 10.

FIG. 8C is a sectional view showing a step of the manufacturing process of the multilayer substrate 10.

FIG. 9 is a top view of a mother insulating layer 116.

FIG. 10 is a top view of a mother insulating layer 118.

FIG. 11 is a sectional view showing a step of the manufacturing process of the multilayer substrate 10.

FIG. 12 is an exploded perspective view of the multilayer substrate 10a.

FIG. 13 is an exploded sectional view of the multilayer substrate 10a.

FIG. 14 is a sectional view showing a step of a manufacturing process of the multilayer substrate 10a.

FIG. 15 is a sectional view showing a step of the manufacturing process of the multilayer substrate 10a.

DETAILED DESCRIPTION OF THE PREFERRED EMBODIMENTS

Multilayer substrates and manufacturing methods of multilayer substrates according to preferred embodiments of the present invention will hereinafter be described with reference to the drawings.

Figure 2A:
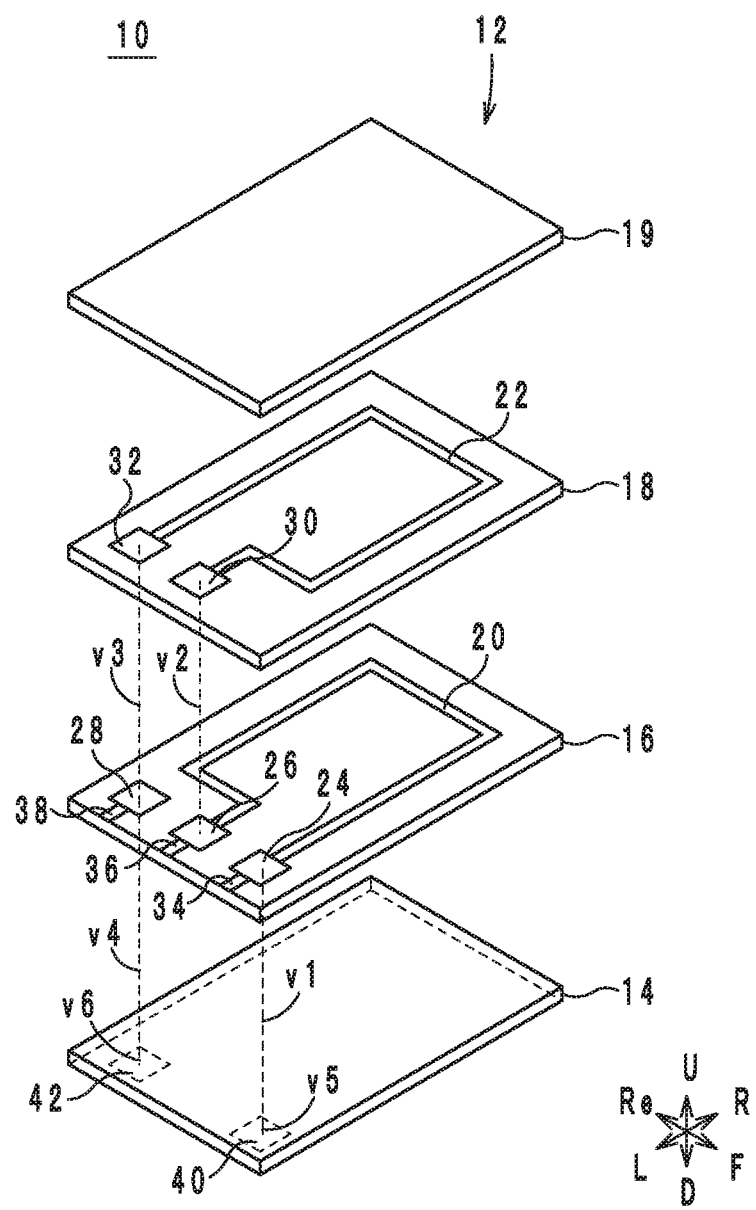
FIG. 2A is an exploded perspective view of the multilayer substrate 10.
Figure 4:
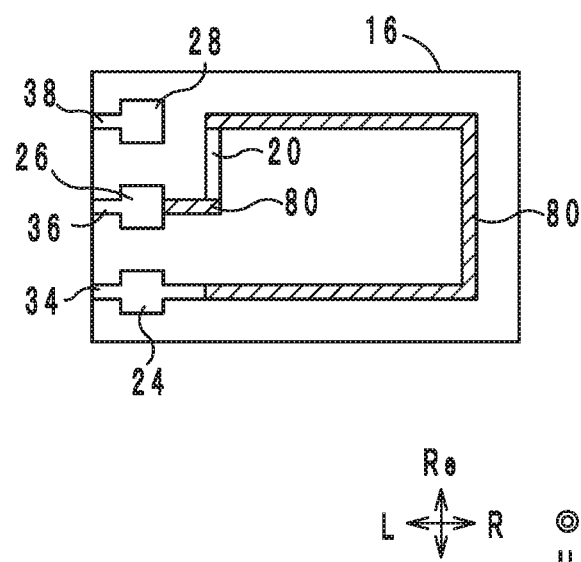
FIG. 4 is a top view of an insulating layer 16.

The structure of a multilayer substrate according to a preferred embodiment of the present invention will be described below with reference to the drawings. FIG. 1 is a perspective view showing the external appearance of multilayer substrates 10 and 10a. FIG. 2A is an exploded perspective view of the multilayer substrate 10. FIG. 2B is an exploded sectional view of the multilayer substrate 10. FIG. 3 is a top transparent view of the multilayer substrate 10. FIG. 3 shows conductor layers 50 and 52. FIG. 4 is a top view of an insulating layer 16. In the following description, the direction in which layers of the multilayer substrate 10 are stacked on one another will be referred to as an up-down direction. When the multilayer substrate 10 is viewed from the up-down direction, a direction in which long sides extend will be referred to as a right-left direction, and a direction in which short sides extend will be referred to as a front-rear direction. The up-down direction, the right-left direction, and the front-rear direction are perpendicular or substantially perpendicular to one another. The up-down direction, the right-left direction, and the front-rear direction are merely examples, and the up-down direction, the right-left direction, and the front-rear direction need not coincide with the up-down direction, the right-left direction, and the front-rear direction when the multilayer substrate 10 is in use.

The multilayer substrate 10 is preferably used, for example, in a cell-phone or any other electronic device. The multilayer substrate 10, as shown in FIGS. 1 to 4, includes an element assembly 12, external electrodes 40 and 42, conductor layers 50 and 52, and via-hole conductors v1 to v6.

The element assembly 12 is preferably a plate-shaped member which is rectangular or substantially rectangular when viewed from above, and is flexible. When the element assembly 12 is viewed from above, the long sides thereof extend in the right-left direction. When the element assembly 12 is viewed from above, the short sides thereof extend in the front-rear direction. However, the shape of the element assembly 12 is an example, and the shape of the element assembly 12 is not limited to the example.

The element assembly 12 includes insulating layers 14, 16, 18, and 19 (the insulating layer 16 being an example of a first insulating layer and the insulating layer 18 being an example of a second insulating layer). In the element assembly 12, the insulating layers 19, 18, 16, and 14 are stacked in layers from top to bottom (an example of from a first side to a second side with respect to the layer stacking direction) in this order. The insulating layers 14, 16, and 18 are preferably made of thermoplastic resin, such as liquid polymer, for example. The insulating layer 19 is preferably made of epoxy resin (resist), for example. These materials are examples, and the materials of the insulating layers 14, 16, 18 and 19 are not limited to the examples.

The conductor layer 50 (an example of a first conductor layer) is disposed on the upper surface of the insulating layer 16 (an example of a first principal surface on the first side of the first insulating layer with respect to the layer stacking direction), and as shown in FIG. 2B, the conductor layer 50 includes an underlayer 50a and a plated layer 50b. The underlayer 50a is a conductor layer which is provided directly on the upper surface of the insulating layer 16. The underlayer 50a has a uniform or substantially uniform thickness. In the following description, a thickness means a dimension in the up-down direction of a conductor layer or an insulating layer. The underlayer 50a is preferably made of Cu, for example. The plated layer 50b is a conductor layer provided on the underlayer 50a. The plated layer 50b is grown by electroplating with the underlayer 50a used as a base electrode. The plated layer 50b is preferably made of Cu, for example. These materials are examples, and the materials of the underlayer 50a and the plated layer 50b are not limited to the examples.

The conductor layer 50, as shown in FIG. 2A, includes a circuit portion 20, connection portions 24, 26 and 28, and lead portions 34, 36 and 38. When viewed from above, the connection portions 24, 26 and 28 (examples of a first connection portion) are preferably rectangular or substantially rectangular and are arranged from the front side to the rear side in this order along the left short side of the upper surface of the insulating layer 16. The lead portions 34, 36, and 38 connect with the connection portions 24, 26, and 28, respectively, and extend to the left short side (an example of an outer edge) of the insulating layer 16. The right ends of the lead portions 34, 36, and 38 connect with the connection portions 24, 26, and 28, respectively, but any other portions of the lead portions 34, 36, and 38 do not connect with any other conductors. Accordingly, the lead portions 34, 26 and 38 are not signal transmission paths.

The circuit portion 20 (an example of a first circuit portion) is a signal transmission path, and is one of the coil conductors defining a coil. However, the circuit portion 20 need not be a portion of a coil, and may be a portion of a wiring, for example. The circuit portion 20 is the portion of the conductor layer 50 at which the conductor layer 50 does not connect with the conductor layer 52 via a via-hole conductor or any other interlayer connection conductor. The connection portions 24, 26, and 28 are signal transmission paths. Therefore, the distinction between the circuit portion 20 and the connection portions 24, 26, and 28 is based on whether or not it is a site at which the conductor layer 50 and the conductor layer 52 are connected.

The circuit portion 20 preferably has a shape like a partially missing rectangular or substantially rectangular ring when viewed from above. More specifically, when viewed from above, the conductor layer 50 includes four sides which are parallel or substantially parallel to the four sides of the upper surface of the insulating layer 16. However, the front half of the left short side of the conductor layer 50 is missing. In the following description, the upstream end of the conductor layer 50 with respect to a counterclockwise direction will be referred to as an upstream end, and the downstream end of the conductor layer 50 with respect to the counterclockwise direction will be referred to as a downstream end. The upstream end of the conductor layer 50 connects with the connection portion 24. The downstream end of the conductor layer 50 connects with the connection portion 26.

In the following description, as shown in FIG. 2B, the portion of the underlayer 50a corresponding to the circuit portion 20 will be referred to as an underlayer 20a, and the portion of the plated layer 50b corresponding to the circuit portion 20 will be referred to as a plated layer 20b. The portions of the underlayer 50a corresponding to the connection portions 24, 26, and 28 will be referred to as underlayers 24a, 26a, 28a, respectively, and the portions of the plated layer 50b corresponding to the connection portions 24, 26, and 28 will be referred to as plated layers 24b, 26b, 28b, respectively. The portions of the underlayer 50a corresponding to the lead portions 34, 36, and 38 will be referred to as underlayers 34a, 36a, 38a, respectively, and the portions of the plated layer 50b corresponding to the lead portions 34, 36, and 38 will be referred to as plated layers 34b, 36b, 38b, respectively. However, the underlayers 34a and 38a and the plated layers 34b and 38b are not shown in FIG. 2B.

The conductor layer 52 (an example of a second conductor layer) is disposed on the upper surface of the insulating layer 18 (an example of a first principal surface on the first side of the second insulating layer with respect to the layer stacking direction). Unlike the conductor layer 50, the conductor layer 52 preferably has a single-layer structure. Therefore, the conductor layer 52 is provided directly on the upper surface of the insulating layer 18. Accordingly, the thickness of the conductor layer 52 is preferably smaller than the thickness of the conductor layer 50, and more preferably, is smaller than the minimum thickness of the conductor layer 50. The thickness of the conductor layer 52 is preferably uniform or substantially uniform. The conductor layer 52 is preferably made of Cu, for example. However, the conductor layer 52 may have a two-layer structure similar to the conductor layer 50. The material is an example, and the material of the conductor layer 52 is not limited to the example.

The conductor layer 52 includes a circuit portion 22, and connection portions 30 and 32. The connection portions 30 and (examples of a second connection portion) are preferably rectangular or substantially rectangular when viewed from above, and the connection portions 30 and 32 are disposed along the left short side of the upper surface of the insulating layer 18 from front to rear in this order. The connection portions 30 and 32 completely or substantially completely overlap the connection portions 26 and 28, respectively, when viewed from above.

The circuit portion 22 (an example of a second circuit portion) is a signal transmission path, and is one of the coil conductors of a coil. However, the circuit portion 22 need not be a portion of a coil, and may be a portion of a wiring, for example. The circuit portion 22 is the portion of the conductor layer 52 at which the conductor layer 52 does not connect with the conductor layer 50 via a via-hole conductor or any other interlayer connection conductor. The connection portions 30 and 32 are also signal transmission paths. Therefore, the distinction between the circuit portion 22 and the connection portions 30 and 32 is based on whether or not it is a site at which the conductor layer 52 and the conductor layer 50 are connected.

The circuit portion 22 has a shape like a partially missing rectangular or substantially rectangular ring when viewed from above. More specifically, when viewed from above, the conductor layer 52 includes four sides which are parallel or substantially parallel to the four sides of the upper surface of the insulating layer 18. However, the rear half of the left short side of the conductor layer 52 is missing. In the following description, the upstream end of the conductor layer 52 with respect to a counterclockwise direction will be referred to as an upstream end, and the downstream end of the conductor layer 52 with respect to the counterclockwise direction will be referred to as a downstream end. The upstream end of the conductor layer 52 is connected to the connection portion 30. The downstream end of the conductor layer 52 is connected to the connection portion 32.

The external electrodes 40 and 42 are disposed on the lower surface of the insulating layer 14, and are preferably rectangular or substantially rectangular when viewed from below. When viewed from below, the external electrode 40 is positioned at the left front corner of the lower surface of the insulating layer 14. When viewed from below, the external electrode 42 is positioned at the left rear corner of the lower surface of the insulating layer 14. When viewed from above, the external electrode 40 overlaps the connection portion 24. When viewed from above, the external electrode 42 overlaps the connection portions 28 and 32. The external electrodes 40 and 42 are preferably made of Cu, for example. The surfaces of the external electrodes 40 and 42 may be plated with Ni, Sn or other suitable material. These materials are examples, and the materials of the external electrodes 40 and 42 are not limited to the examples.

The via-hole conductor v1 extends through the insulating layer 16 in the up-down direction. The via-hole conductor v5 extends through the insulating layer 14 in the up-down direction. The via-hole conductors v1 and v5 are connected in series and thus connect the connection portion 24 and the external electrode 40. The via-hole conductor v2 extends through the insulating layer 18 in the up-down direction to connect the connection portion 26 and the connection portion 30. The via-hole conductor v3 extends through the insulating layer 18 in the up-down direction to connect the connection portion 28 and the connection portion 32. The via-hole conductor v4 extends through the insulating layer 16 in the up-down direction. The via-hole conductor v6 extends through the insulating layer 14 in the up-down direction. The via-hole conductors v4 and v6 are connected in series and thus connect the connection portion 28 and the external electrode 42. Thus, the conductor layer 50 and the conductor layer 52 are connected to each other with the connection portions 26 and 30 being connected to each other by the via-hole conductor v2 and with the connection portions 28 and 32 being connected to each other by the via-hole conductor v3. Also, the connection portion 26 and the connection portion 30 are connected to each other by the via-hole conductor v2, and thus, the circuit portion 20 and the circuit portion 22 are electrically connected in series. Thus, the circuit portions 20 and 22, the connection portions 26 and 30, and the via-hole conductor v2 define a spiral coil. The via-hole conductors v1 to v6 are preferably made of Cu, Sn, Ag or other suitable materials, for example. These materials are examples, and the material of the via-hole conductors v1 to v6 is not limited to the examples.

Now, the positional relationship between the circuit portion 20 and the circuit portion 22 is described in more detail in reference to FIGS. 3 and 4. When viewed from above, the circuit portion 20 and the circuit portion 22 overlap each other in cross-hatched parts in FIG. 3. Specifically, when viewed from above, the front long side, the right short side and the rear long side of the circuit portion 20 overlap the front long side, the right short side and the rear long side of the circuit portion 22. Further, when viewed from above, the downstream end portion of the circuit portion 20 overlaps the upstream end portion of the circuit portion 22. In the following description, the portions of the circuit portion 20 which overlap the circuit portion 22 when viewed from above will be referred to as overlapping portions 80. In other words, the circuit portion 20 includes overlapping portions 80.

As shown in FIG. 2B, the maximum thicknesses of the portions of the connection portions 26 and 28 which connect with the connection portions 30 and 32, respectively (that is, the portions of the connection portions 26 and 28 at which the connection portions 26 and 28 contact the via-hole conductors v2 and v3, respectively) and the lead portions 36 and 38 are greater than the maximum thicknesses of the overlapping portions 80. In the present preferred embodiment, as shown in FIG. 2B, the maximum thicknesses of the portions of the connection portions 26 and 28 which connect with the connection portions 30 and 32, respectively, and the lead portions 36 and 38 are greater than the maximum thickness of the circuit portion 20. The via-hole conductors v2 and v3 contact the connection portions 26 and 28, respectively. However, the via-hole conductor v2 is a separate body from the connection portion 26, and the via-hole conductor v3 is a separate body from the connection portion 28. Therefore, the thicknesses of the portions of the connection portions 26 and 28 which connect with the connection portions 30 and 32 mean the respective thicknesses of the conductor layers lying between the upper surface of the insulating layer 16 and the lower surface of the insulating layer 18 (that is, between the upper surface of the insulating layer 16 and the respective lower ends of the via-hole conductors v2 and v3), and the maximum thicknesses thereof mean the respective maximum values of the thicknesses.

Also, the maximum thicknesses of the connection portions 26 and 28 are greater than the maximum thickness of the circuit portion 20 (especially than the thicknesses of the overlapping portions 80). Thus, not only the portions of the connection portions 26 and 28 which connect with the connection portions 30 and 32, respectively, but also the other portions of the connection portions 26 and 28 have greater thicknesses than the thickness of the circuit portion 20 (especially than the thicknesses of the overlapping portions 80). Further, the lead portions 36 and 38 have greater thicknesses than the thicknesses of the connection portions 26 and 28. Accordingly, in the multilayer substrate 10, the conductor layer 50 decreases in thickness from the left side to the right side.

As shown in FIG. 2B, the maximum thicknesses of the connection portion 24 and the lead portion 34 are greater than the maximum thickness of the circuit portion 20 (specifically than the thickness of the overlapping portions 80). Further, the maximum thickness of the lead portion 34 is greater than the maximum thickness of the connection portion 24.

A non-limiting example of a manufacturing method of the multilayer substrate 10 will be described below with reference to the drawings. FIGS. 5 to 8C and 11 are sectional views showing a manufacturing process of the multilayer substrate 10. FIG. 9 is a top view of a mother insulating layer 116. FIG. 10 is a top view of a mother insulating layer 118.

First, as shown in FIG. 5, an insulating layer which is preferably made of, for example, liquid polymer and includes an upper surface entirely or substantially entirely covered with a Cu foil 152 is prepared as the mother insulating layer 118 (an example of a second mother insulating layer). In the following description, a mother insulating layer means a large-sized insulating layer which is sufficient for a plurality of insulating layers for a plurality of multilayer substrates 10 when viewed from above. The Cu foil 152 may preferably be formed, for example, by adhering a thin metal foil of Cu on the upper surface of the mother insulating layer 118 or by forming a metal thin film of Cu on the upper surface of the mother insulating layer 118 by plating. The metal film or foil formed on the upper surface of the mother insulating layer 118 need not be Cu and may be any other suitable metal.

Next, as shown in FIGS. 6 to 10, a plurality of conductor layers 52 (an example of a plurality of second conductor layers) are formed on the upper surface of the mother insulating layer 118 by photolithography, for example. Specifically, resists having the same or substantially the same shape as the conductor layer 52 are printed on the Cu foil 152. Then, the Cu foil 152 is etched, and thus, the portions of the Cu foil 152 uncovered by the resists are removed. Thereafter, the resists are removed. In this manner, as shown in FIG. 10, ten conductor layers 52, for example, are formed on the upper surface of the mother insulating layer 118. Specifically, three conductor layers 52 are arranged in the right-left direction along the rear short side of the mother insulating layer 118. Another three conductor layers 52 are arranged in the right-left direction along the front short side of the mother insulating layer 118. Another two conductor layers 52 are arranged in the front-rear direction along the right longer side of the mother insulating layer 118. Also, another two conductor layers 52 are arranged in the front-rear direction along the left longer side of the mother insulating layer 118. In this regard, the ten conductor layers 52 are formed such that the outer edge of the mother insulating layer 118 is at a shorter distance from the connection portions 30 and 32 (an example of a plurality of second connection portions) than from the circuit portions 22.

Next, as shown in FIG. 7, the via-hole conductors v2 and v3 (an example of a plurality of interlayer connection portions, the via-hole conductors v3 not shown in FIG. 7) are formed in the mother insulating layer 118. Specifically, the lower surface of the mother insulating layer 118 is irradiated with laser beams such that via-holes are formed at the positions at which the via-hole conductors v2 and v3 are to be formed. Thereafter, the via-holes are filled with a conductive paste preferably mainly including of Cu, for example.

Next, as shown in FIG. 8A, an insulating layer which is preferably made of liquid polymer and has an upper surface entirely or substantially entirely covered with a Cu foil 150 is prepared as the mother insulating layer 116 (an example of a first mother insulating layer). The Cu foil 150 may be formed, for example, by adhering a thin metal foil of Cu on the upper surface of the mother insulating layer 116 or by forming a metal thin film of Cu on the upper surface of the mother insulating layer 116 by plating. The metal film or foil formed on the upper surface of the mother insulating layer 116 need not be Cu and may be any other metal.

Next, as shown in FIGS. 8B and 9, a plurality of underlayers 50a are formed on the upper surface of the mother insulating layer 116 by photolithography, for example. Specifically, resists having the same or substantially the same shape as the underlayer 50a are printed on the Cu foil 150. Then, the Cu foil 150 is etched, and thus, the portions of the Cu foil 150 uncovered with the resists are removed. Thereafter, the resists are removed. In this manner, as shown in FIG. 9, ten underlayers 50a are formed on the upper surface of the mother insulating layer 116. Specifically, three underlayers 50a are arranged in the right-left direction along the rear short side of the mother insulating layer 116. Another three underlayers 50a are arranged in the right-left direction along the front short side of the mother insulating layer 116. Another two underlayers 50a are arranged in the front-rear direction along the right long side of the mother insulating layer 116. Also, another two underlayers 50a are arranged in the front-rear direction along the left long side of the mother insulating layer 116. In this regard, the ten underlayers 50a are formed such that the outer edge of the mother insulating layer 116 is at a shorter distance from the underlayers 24a, 26a and 28a of the connection portions 24, 26 and (an example of first connection portions) than from the underlayers 20a of the circuit portions 20. Further, the plurality of underlayers 50a includes a lead portion 160a. The lead portion 160a is disposed between the outer edge of the mother insulating layer 116 and the underlayers 24a, 26a and 28a of the connection portions 24, 26 and 28, and the lead portion 160a extends along the outer edge of the mother insulating layer 116 and forms a rectangle.

Next, the via-hole conductors v1 and v4 are formed in the mother insulating layer 116. Specifically, the lower surface of the mother insulating layer 116 is irradiated with laser beams such that via-holes are formed at the positions at which the via-hole conductors v1 and v4 are to be formed. Thereafter, the via-holes are filled with a conductive paste preferably mainly including Cu, for example.

Next, as shown in FIG. 8C, the Cu plated layers 50b are formed on the underlayers 50a by electroplating, for example, (that is, by plating) with the underlayers 50a used as base electrodes. In this regard, electric power is fed via the lead portion 160a (not shown in FIG. 8C). Thus, a plurality of conductor layers 50 including plated layers 50b (an example of a plurality of first conductor layers) are formed on the upper surface of the mother insulating layer 116. In each of the conductor layers 50, the plated layer 50b is relatively thick in the portions relatively near the lead portion 160a and is made relatively thin in the portions relatively far away from the lead portion 160a. Accordingly, in each of the conductor layers 50, the lead portions 34, 36, and 38 are made the thickest, and the circuit portion 20 is made the thinnest.

In order to make the thicknesses of the connection portions 24, 26 and 28 and the lead portions 34, 36 and 38 greater than the thicknesses of the circuit portions 20, plating is performed with the underlayers 20a of the circuit portions 20 covered with masks. Thereafter, the masks are removed, and plating is performed again. In this manner, the thicknesses of the plated portions 24b, 26b, 28b, 34b, 36b, and 38b become greater than the thicknesses of the plated portions 20b.

Next, in the mother insulating layer 114, the external electrodes 40 and 42, and the via-hole conductors v5 and v6 are formed. Since the process of forming the external electrodes 40 and 42, and the via-hole conductors v5 and v6 is the same or substantially the same as the process of forming the conductor layers 52, and the via-hole conductors v2 and v3, any further description of the process will not be provided.

Next, as shown in FIG. 11, the mother insulating layers 118, 116, and 114 are stacked in layers from top to bottom in this order, and the stack is subjected to a heat treatment and a pressure treatment, such that the mother insulating layers 114, 116, and 118 are pressure bonded together. In this regard, the mother insulating layers 114, 116, and 118 are softened by the heat treatment. Thereafter, the mother insulating layers 114, 116, and 118 are cooled and solidified, and thus are bonded together. Also, the conductive paste in the via-holes is solidified by heat, and thus, the via-hole conductors v1 to v6 are formed.

Next, epoxy resin is applied to cover the conductor layers 52 and the upper surfaces of the mother insulating layers 118, and thus, the insulating layers 19 are formed. In this manner, a mother element assembly 112 is produced.

Lastly, the mother element assembly 112 is cut into a plurality of element assemblies 12. In this regard, the outer edge portion of the mother element assembly 112 when viewed from above is cut, and thus, the rectangular or substantially rectangular lead portion is cut off. Through the process above, the multilayer substrate 10 is produced.

In the multilayer substrate 10 having the above-described structure, the risk of a short circuit between the conductor layer 50 and the conductor layer 52 is reduced. More specifically, as shown in FIG. 2B, the maximum thicknesses of the portions of the connection portions 26 and 28 which are connected to the connection portions 30 and 32, respectively, and the lead portions 36 and 38 are greater than the maximum thicknesses of the overlapping portions 80. In other words, the overlapping portions 80 are relatively thin. Accordingly, the interval between the circuit portion 20 and the circuit portion 22 is unlikely to become too small, and a short circuit between the circuit portion 20 and the circuit portion 22 is less likely to occur.

In the multilayer substrate 10, the reliability of a connection between the conductor layer 50 and the conductor layer is improved. More specifically, as shown in FIG. 2B, the maximum thicknesses of the portions of the connection portions 26 and 28 which are connected to the connection portions 30 and 32, respectively, and the lead portions 36 and 38 are greater than the maximum thickness of the overlapping portions 80. In other words, the portions of the connection portions 26 and 28 which are connected to the connection portions 30 and 32 are relatively thick. Accordingly, in the pressure bonding step shown in FIG. 11, before the circuit portion 20 is brought into contact with the lower surface of the insulating layer 18, the lower ends of the via-hole conductors v2 and v3 are brought into contact with the connection portions 26 and 28, respectively. Therefore, a great pressure is applied to the via-hole conductor v2 and the connection portion 26 and to the via-hole conductor v3 and the connection portion 28 for a long time. This ensures firm connections between the via-hole conductor v2 and the connection portion 26 and between the via-hole conductor v3 and the connection portion 28. Thus, in the multilayer substrate 10, the reliability of a connection between the conductor layer 50 and the conductor layer 52 is improved.

The manufacturing method of the multilayer substrate 10 described above enables the connection portions 26 and 28 to have thicknesses greater than the thickness of the circuit portion 20 and enables the lead portions 36 and 38 to have thicknesses greater than the thickness of the circuit portion 20. More specifically, Cu electroplating (that is, plating) is performed with the underlayer 50a used as a base electrode, such that the Cu plated layer 50b is formed. At the time, power is fed through the lead portion 160a. Accordingly, the plated layer 50b in the portion of the conductor layer 50 which is relatively near the lead portion 160a becomes relatively thick, and the plated layer 50b in the portion of the conductor layer 50 which is relatively far away from the lead portion 160a becomes relatively thin. Therefore, the thicknesses of the lead portions 36 and 38 become the greatest, and the thickness of the circuit portion 20 becomes the smallest. Consequently, the above-described manufacturing method of the multilayer substrate 10 enables the connection portions 26 and 28 to have maximum thicknesses greater than the maximum thickness of the circuit portion 20 and enables the lead portions 36 and 38 to have maximum thicknesses greater than the maximum thickness of the circuit portion 20.

Figure 12:
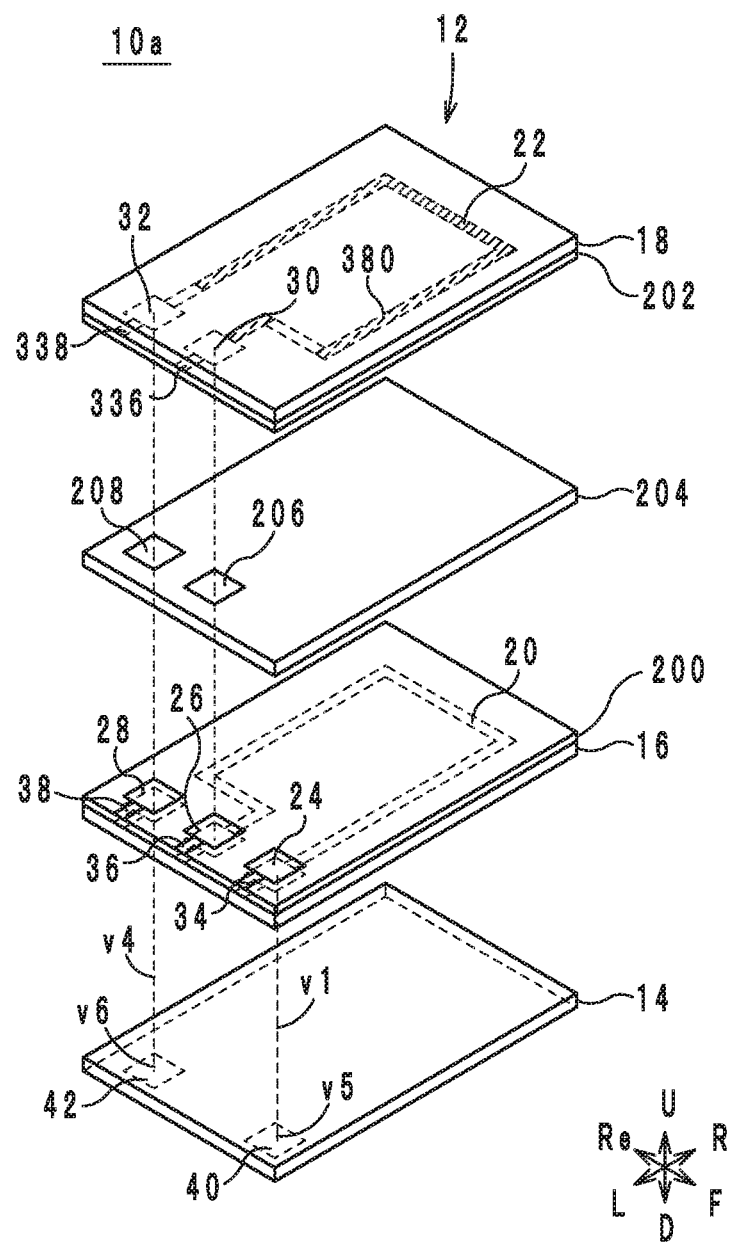
Figure 13:
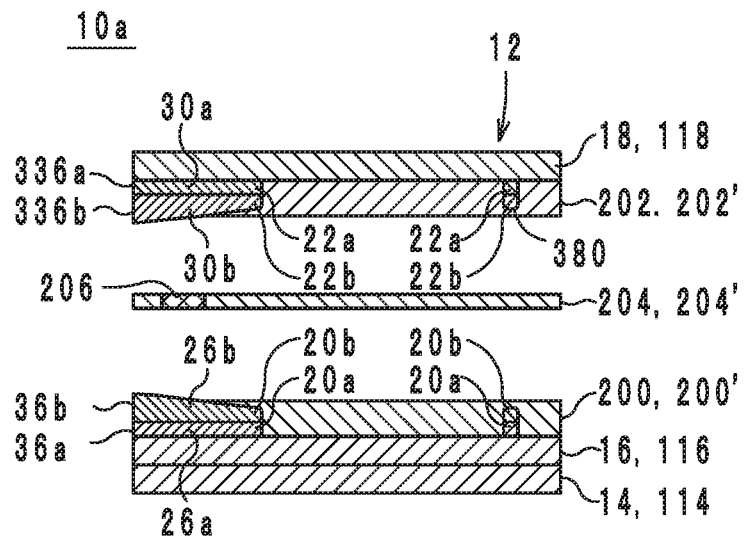

A multilayer substrate 10a according to a first modification of a preferred embodiment of the present invention and a manufacturing method of the multilayer substrate 10a will be described below in reference to the drawings. FIG. 12 is an exploded perspective view of the multilayer substrate 10a. FIG. 13 is an exploded sectional view of the multilayer substrate 10a.

The multilayer substrate 10a differs from the multilayer substrate 10 in that the multilayer substrate 10a further includes insulating layers 200, 202, and 204 and that the conductor layer 52 is disposed on the lower surface of the insulating layer 18. The following description of the multilayer substrate 10a focuses on the differences.

In the multilayer substrate 10a according to the first modification of a preferred embodiment of the present invention, the conductor layer 52 is disposed on the lower surface of the insulating layer 18, and the conductor layer 52 has the same or substantially the same shape as the conductor layer 52 of the multilayer substrate 10. However, the conductor layer 52 of the multilayer substrate 10a has a two-layer structure including an underlayer 52a and a plated layer 52b. Also, the conductor layer 52 further includes lead portions 336 and 338. The lead portions 336 and 338 are connected to the connection portions 30 and 32, respectively, and extend to the left short side of the lower surface of the insulating layer 18. In the following description, the portions of the circuit portion 22 which overlap the circuit portion 20 when viewed from above will be referred to as overlapping portions 380. In other words, the circuit portion 22 includes overlapping portions 380. The overlapping portions 380 are the same or substantially the same shape as the overlapping portions 80.

As shown in FIG. 13, the maximum thicknesses of the portions of the connection portions 30 and 32 which are connected to the connection portions 26 and 28, respectively (that is, the portions of the connection portions 30 and 32 at which the connection portions 30 and 32 contact conductive adhesive portions 206 and 208, respectively) and the lead portions 36 and 38 are greater than the maximum thickness of the overlapping portions 380. In the present preferred embodiment, as shown in FIG. 13, the maximum thicknesses of the portions of the connection portions 30 and 32 which are connected to the connection portions 26 and 28, respectively, and the lead portions 336 and 338 are greater than the maximum thickness of the circuit portion 22.

The maximum thicknesses of the connection portions 30 and 32 are greater than the maximum thickness of the circuit portion 22 (especially than the thickness of the overlapping portions 380). Thus, not only the portions of the connection portions 30 and 32 which are connected to the connection portions and 28, respectively, but also the other portions of the connection portions 30 and 32 have greater thicknesses than the thickness of the circuit portion 22 (especially than the thickness of the overlapping portions 380). Further, the lead portions 336 and 338 have greater thicknesses than the thicknesses of the connection portions 30 and 32. Accordingly, in the multilayer substrate 10a, the conductor layer 52 decreases in thickness from the left side to the right side.

The element assembly 12 of the multilayer substrate 10a includes insulating layers 14, 16, 18, 200, 202, and 204 (the insulating layer 200 being an example of a third insulating layer). In the element assembly 12, the insulating layers 18, 202, 204, 200, 16, and 14 are stacked in layers from top to bottom in this order.

The insulating layer 202 covers the upper surface of the insulating layer 18 and the conductor layer 52. However, as shown in FIG. 13, the connection portions 30 and 32 are exposed on the lower surface of the insulating layer 202.

The insulating layer 200 covers the lower surface of the insulating layer 16 and the conductor layer 50. However, as shown in FIG. 13, the connection portions 24, 26 and 28 are exposed on the upper surface of the insulating layer 200. The insulating layers 200 and 202 are preferably made of epoxy resin, for example.

The insulating layer 204 is an adhesive layer that bonds the insulating layer 16 with the insulating layer 200 disposed thereon and the insulating layer 18 with the insulating layer 202 disposed thereon. The insulating layer 204 is preferably made of epoxy resin, for example.

The multilayer substrate 10a further includes conductive adhesive portions 206 and 208. The conductive adhesive portion 206 extends through the insulating layer 204 in the up-down direction, and when the element assembly 12 is viewed from above, the conductive adhesive portion 206 overlaps the connection portions 26 and 30. Accordingly, the conductive adhesive portion 206 connects the connection portion 26 and the connection portion 30. The conductive adhesive portion 208 extends through the insulating layer 204 in the up-down direction, and when the element assembly 12 is viewed from above, the conductive adhesive portion 208 overlaps the connection portions 28 and 32. Accordingly, the conductive adhesive portion 208 connects the connection portion 28 and the connection portion 32. In the conductive adhesive portions 206 and 208, preferably, for example, metal particles are dispersed in resin. As the conductive adhesive portions 206 and 208, for example, anisotropic conductor films may preferably be used. There are no other structural differences between the multilayer substrate 10a and the multilayer substrate 10, and no further description of the structure of the multilayer substrate 10a will be provided.

Figure 14:
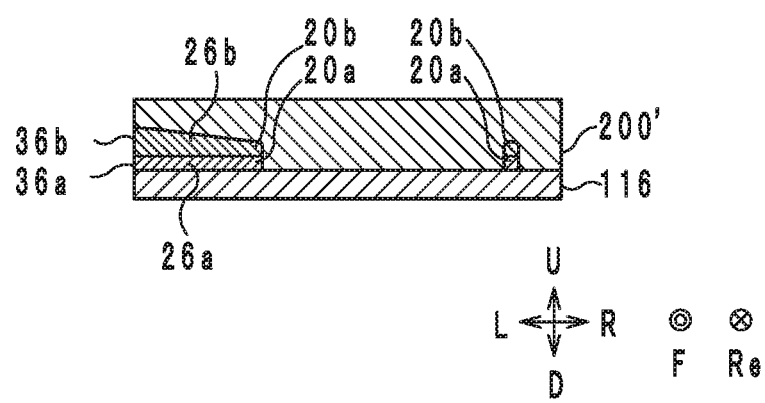
Figure 15:
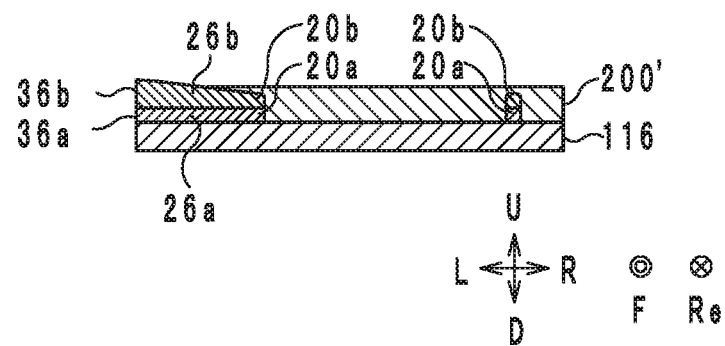

A non-limiting example of a manufacturing method of the multilayer substrate 10a will be described below in reference to the drawings. FIGS. 14 and 15 are sectional views showing a manufacturing process of the multilayer substrate 10a.

The conductor layers 50 are formed on the upper surface of a mother insulating layer 116 by the same or similar process as described in the manufacturing method of the multilayer substrate 10 with reference to FIGS. 8A to 8C, and no further description of the process will be given.

Next, as shown in FIG. 14, epoxy resin is applied onto the upper surface of the mother insulating layer 116, and thus, a mother insulating layer 200' is formed. At the time, the epoxy resin is applied to be slightly thicker such that the conductor layer 50 is able to be embedded in the mother insulating layer 200'. Therefore, the thickness of the epoxy resin is greater than the thickness of the conductor layer 50.

Next, as shown in FIG. 15, the mother insulating layer 200' is partially removed by CMP (chemical mechanical polishing), asking or other suitable method such that the connection portions 24, 26 and 28, and the lead portions 34, 36 and 38 are exposed on the upper surface of the mother insulating layer 200'.

Next, the process shown in FIGS. 8A to 8C is repeated to form conductor layers 52 on the lower surface of a mother insulating layer 118. Further, the process shown in FIGS. 14 and 15 is repeated to form a mother insulating layer 202' on the lower surface of the mother insulating layer 118.

Next, the external electrodes 40 and 42, and the via-hole conductors v5 and v6 are formed in the mother insulating layer 114. The process of forming the external electrodes 40 and 42, and the via-hole conductors v5 and v6 of the multilayer substrate 10a is the same as or similar to the process of forming those portions of the multilayer substrate 10, and no further description of the process will be given.

Next, the mother insulating layer 114 and the mother insulating layer 116 are stacked in layers, and the stack is subjected to a heat treatment and a pressure treatment. Thus, the mother insulating layers 114 and 116 are pressure bonded together. In this manner, the mother insulating layer 114 and the mother insulating layer 116 are joined together.

Next, as shown in FIG. 13, the mother insulating layers 118, 202', 204', 200', 116 and 114 are stacked in layers from top to bottom in this order, and the stack is subjected to a heat treatment and a pressure treatment. Thus, a mother element assembly 112 is produced. The mother insulating layers 118, 202', 204', 200', 116 and 114 may be joined together in one-time pressure bonding.

Lastly, the mother element assembly 112 is cut into a plurality of element assemblies 12. In this regard, when viewed from above, the outer edge portion of the mother element assembly 112 is cut such that the rectangular or substantially rectangular lead portion is cut off. Through the process, the multilayer substrate 10a is produced.

In the multilayer substrate 10a having the above-described structure, as in the multilayer substrate 10, the risk of a short circuit between the circuit portion 20 and the circuit portion 22 is reduced. In the multilayer substrate 10a, as in the multilayer substrate 10, the reliability of a connection between the conductor layer 50 and the conductor layer 52 is improved.

As in the case of the multilayer substrate 10, the method of the multilayer substrate 10a enables the connection portions 26 and 28 to have maximum thicknesses greater than the maximum thickness of the circuit portion 20 and enables the lead portions 36 and 38 to have maximum thicknesses greater than the maximum thickness of the circuit portion 20. The method of the multilayer substrate 10a also enables the connection portions 30 and 32 to have thicknesses greater than the thickness of the circuit portion 22 and enables the lead portions 336 and 338 to have thicknesses greater than the thickness of the circuit portion 22.

In the multilayer substrate 10a, at least one of the conductor layers 50 and 52 may be a conductor layer which does not include a plated layer and has a uniform or substantially uniform thickness.

In the multilayer substrate 10a, if the insulation between the circuit portion 20 and the circuit portion 22 is ensured by the insulating layer 204, either or both of the insulating layers 200 and 202 may be omitted.

If the insulation between the circuit portion 20 and the circuit portion 22 is ensured by the insulating layers 200 and 202, the insulating layer 204 may be omitted. In this case, the connection portions 26 and 28 are connected directly to the connection portions 30 and 32, respectively.

Figure 16:
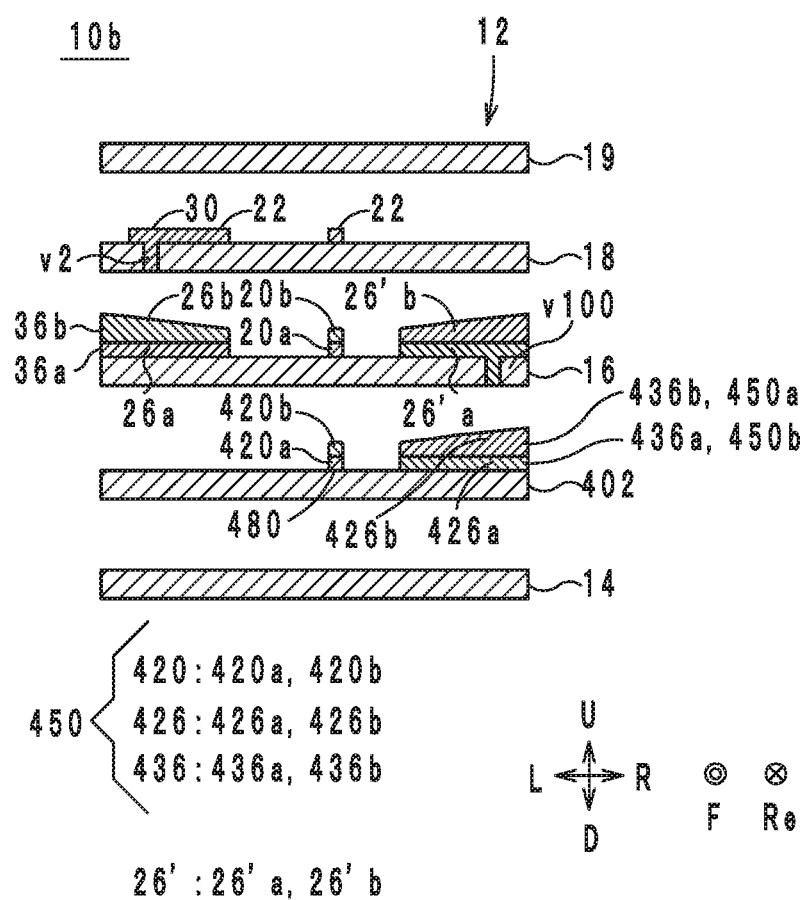
FIG. 16 is an exploded sectional view of a multilayer substrate 10b.

A multilayer substrate 10b according to a second modification of a preferred embodiment of the present invention will be described below in reference to the drawings. FIG. 16 is an exploded sectional view of the multilayer substrate 10b.

The multilayer substrate 10b differs from the multilayer substrate 10 in that the multilayer substrate 10b further includes an insulating layer 402 and a conductor layer 450. The following description of the multilayer substrate 10b focuses on the difference.

The insulating layer 402 is positioned between the insulating layer 14 and the insulating layer 16. The insulating layer 402 is preferably made of thermoplastic resin, such as liquid polymer, for example.

The conductor layer 450 is disposed on the upper surface of the insulating layer 402, and the conductor layer 450 has a two-layer structure including an underlayer 450a and a plated layer 450b. The conductor layer 450 includes a circuit portion 420, a connection portion 426, and a lead portion 436.

The circuit portion 420 defines a signal transmission path and a portion of a coil. The connection portion 426 is connected to a connection portion 26' of the conductor layer 50 by a via-hole conductor v100. The lead portion 436 connects with the connection portion 426 and extends to the right short side of the upper surface of the insulating layer 402. The portion of the circuit portion 420 which overlaps the connection portion 22 will hereinafter be referred to as an overlapping portion 480. In other words, the connection portion 420 includes an overlapping portion 480.

As shown in FIG. 16, the maximum thicknesses of the portion of the connection portion 426 which is connected to the connection portion 26' (that is, the portion of the connection portion 426 at which the connection portion 426 contacts the via-hole conductor v100) and the lead portion 436 are greater than the maximum thickness of the overlapping portion 480. In the present preferred embodiment, as shown in FIG. 16, the maximum thicknesses of the portion of the connection portion 426 which is connected to the connection portion 26' and the lead portion 436 are greater than the maximum thickness of the circuit portion 420.

In the multilayer substrate 10b having the above-described structure, the risk of a short circuit between the circuit portion 20 and the circuit portion 22 is reduced as in the multilayer substrate 10, and the risk of a short circuit between the circuit portion 22 and the circuit portion 420 is reduced. In the multilayer substrate 10b, the reliability of a connection between the conductor layer 50 and the conductor layer 52 is improved as in the multilayer substrate 10, and the reliability of a connection between the conductor layer 50 and the conductor layer 450 is improved.

Multilayer substrates and manufacturing methods of multilayer substrates according to the present invention are not limited to the multilayer substrates 10, 10a and 10b, and the manufacturing methods of the multilayer substrates 10, 10a and 10b according to preferred embodiments of the present invention, and it is possible to make various changes and modifications within the scope of the present invention.

The elements of the multilayer substrates 10, 10a and 10b and the manufacturing methods of the multilayer substrates 10, 10a and 10b may be combined arbitrarily.

The conductor layers 50 and 52 may define a spiral shape including a plurality of turns when viewed from above. In this specification, the concept of a spiral shape includes a three-dimensionally spiral shape and a two-dimensionally spiral shape.

Instead of the via-hole conductors v1 to v6 and v100, through-holes with a plated inner surface may be used.

On the mother insulating layer 116 shown in FIG. 9, the lead portion 160a need not be provided. In this case, electroplating is performed with the underlayers 24a, 26a and 28a used as starting points.

As thus far described, preferred embodiments of the present invention are useful for multilayer substrates and manufacturing methods of multilayer substrates, and are excellent especially in reducing the risk of a short circuit between conductor layers.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer substrate comprising:
    an element assembly including a first insulating layer, a second insulating layer, and a third insulating layer, stacked in layers such that the second insulating layer, the third insulating layer, and the first insulating layer are arranged in this order from a first side to a second side with respect to a layer stacking direction;
    a first conductor layer disposed on a first principal surface of the first insulating layer and including a plated layer, the first principal surface being on a first side of the first insulating layer with respect to the layer stacking direction; and
    a second conductor layer disposed on a second principal surface of the second insulating layer, the second principal surface being on a second side of the second insulating layer with respect to the layer stacking direction; wherein
    the first conductor layer further includes a first connection portion which includes the plated layer and a first circuit portion which defines a signal transmission path;

the second conductor layer includes a second connection portion and a second circuit portion which defines a signal transmission path;

the first connection portion and the second connection portion are connected to each other by a conductive adhesive portion that extends through the third insulating layer in the layer stacking direction;

the conductive adhesive portion includes metal particles dispersed in resin;

a thickness of the first connection portion increases in a direction where the first connection portion and the second connection portion approach each other;

the first connection portion is made of Cu;

the conductive adhesive is physically connected to the first connection portion and the second connection portion;

when viewed from the layer stacking direction, the first circuit portion includes an overlapping portion which includes the plated layer and which overlaps the second circuit portion;

a portion of the first connection portion which is connected to the second connection portion has a maximum thickness greater than a maximum thickness of the overlapping portion; and the first conductor layer further includes an extending portion that is directly connected to the first connection portion and extends from the first connection portion when viewed from the layer stacking direction;

the extending portion has a minimum thickness equal to or greater than a maximum thickness of the first connection portion;

the extending portion has a maximum thickness greater than the maximum thickness of the first connection portion; and the conductive adhesive portion is directly in contact with the first connection portion and is not directly in contact with the extending portion.

2. The multilayer substrate according to claim 1, wherein the extending portion extends to an outer edge of the first insulating layer when viewed from the layer stacking direction; and the extending portion has a thickness greater than the thickness of the overlapping portion.

3. The multilayer substrate according to claim 1, wherein the first conductor layer further includes an underlayer conductor disposed on the first principal surface of the first insulating layer, the first principal surface being on the first side of the first insulating layer with respect to the layer stacking direction; and the plated layer is disposed on the underlayer conductor.

4. The multilayer substrate according to claim 1, wherein the first connection portion and the second connection portion are portions of a coil.

5. The multilayer substrate according to claim 1, wherein the second insulating layer is made of thermoplastic resin.

* * * * *